US007826015B2

(12) United States Patent
Ochiai et al.

(10) Patent No.: US 7,826,015 B2
(45) Date of Patent: Nov. 2, 2010

(54) IN-PLANE SWITCHING TRANSFLECTIVE LIQUID CRYSTAL DISPLAY DEVICE WITH THE PIXEL ELECTRODE ELECRICALLY COUPLED TO THE ACTIVE ELEMENT IN A PORTION DEFINING A CLEARANCE BETWEEN THE FIRST ELECTRODES FOR THE TRANSMISSION AND REFLECTIVE SECTIONS

(75) Inventors: Takahiro Ochiai, Chiba (JP); Takayuki Nakao, Atsugi (JP); Toshio Miyazawa, Chiba (JP); Masahiro Maki, Mobara (JP); Tohru Sasaki, Mobara (JP)

(73) Assignee: Hitachi Displays, Ltd., Chiba-ken (JP)

( * ) Notice: Subject to any disclaimer, the term of this patent is extended or adjusted under 35 U.S.C. 154(b) by 410 days.

(21) Appl. No.: 11/783,071

(22) Filed: Apr. 5, 2007

(65) Prior Publication Data
US 2007/0241332 A1  Oct. 18, 2007

(30) Foreign Application Priority Data
Apr. 12, 2006 (JP) .............................. 2006-109659

(51) Int. Cl.
G02F 1/1335 (2006.01)
G02F 1/136 (2006.01)
G02F 1/1343 (2006.01)
(52) U.S. Cl. .................... 349/114; 349/141; 349/144
(58) Field of Classification Search ................. 349/114, 349/141
See application file for complete search history.

(56) References Cited

U.S. PATENT DOCUMENTS

| 5,847,687 | A | 12/1998 | Hirakata et al. |
| 6,914,656 | B2 | 7/2005 | Sakamoto et al. |
| 2001/0050745 | A1 | 12/2001 | Liu et al. |
| 2002/0118318 | A1 | 8/2002 | Hidehira et al. |
| 2005/0062922 | A1 | 3/2005 | Nakayama et al. |
| 2005/0128389 | A1* | 6/2005 | Yang ........................... 349/114 |
| 2006/0164575 | A1* | 7/2006 | Su et al. ..................... 349/114 |
| 2006/0215087 | A1* | 9/2006 | Matsushima et al. ........ 349/114 |
| 2007/0002226 | A1 | 1/2007 | Sakamoto et al. |
| 2007/0103626 | A1* | 5/2007 | Morimoto et al. ........... 349/114 |
| 2007/0126969 | A1* | 6/2007 | Kimura et al. ............... 349/141 |

FOREIGN PATENT DOCUMENTS

| CN | 1472569 A | 8/2002 |
| JP | 10-31464 | 3/1997 |

(Continued)

Primary Examiner—Andrew Schechter
Assistant Examiner—Dennis Y Kim
(74) Attorney, Agent, or Firm—Stites & Harbison, PLLC; Juan Carlos A. Marquez, Esq

(57) ABSTRACT

A liquid crystal display device having a liquid crystal display panel includes a first substrate, a second substrate, and liquid crystal interposed between the first and second substrates. The first substrate includes an active element, a first insulating film formed on the active element, a plurality of first electrodes disposed on the first insulating film, a second insulating film disposed on the first electrodes, and a pixel electrode disposed on the second insulating film. The pixel electrode is electrically coupled to the active element via a portion defining a contact hole formed in a portion defining a clearance between the plurality of first electrodes.

11 Claims, 11 Drawing Sheets

FOREIGN PATENT DOCUMENTS

| | | |
|---|---|---|
| JP | 2000-267128 | 3/1999 |
| JP | 2001-194685 | 1/2000 |
| JP | 2002-328385 | 4/2001 |
| JP | 2002-23185 | 5/2001 |
| JP | 2003-344837 | 5/2002 |
| JP | 2007-127933 | 11/2005 |
| JP | 2007-41572 | 6/2006 |

* cited by examiner (a)   (b)

IN-PLANE SWITCHING TRANSFLECTIVE LIQUID CRYSTAL DISPLAY DEVICE WITH THE PIXEL ELECTRODE ELECRICALLY COUPLED TO THE ACTIVE ELEMENT IN A PORTION DEFINING A CLEARANCE BETWEEN THE FIRST ELECTRODES FOR THE TRANSMISSION AND REFLECTIVE SECTIONS

CLAIM OF PRIORITY

The present application claims priority from Japanese Application JP 2006-109659 filed on Apr. 12, 2006, the content of which is hereby incorporated by reference into this application.

BACKGROUND OF THE INVENTION (1) Field of the Invention

The present invention relates to a liquid crystal display device, particularly to an in-plane switching (hereinafter referred to as "IPS"), semi-transmissive liquid crystal display device.

(2) Description of the Related Art

Semi-transmissive liquid crystal display devices that have a transmission section and a reflection section in a subpixel have been used as displays for portable devices.

These semi-transmissive liquid crystal display devices employ the vertical electric field method in which liquid crystal interposed between a pair of substrates is driven by applying an electric field in a direction perpendicular to the planes of the pair of substrates. Those display devices have a step between the transmission and reflection sections so as to match the properties of the transmission section and those of the reflection section with each other, as well as have a phase difference plate between a polarizing plate and a liquid crystal layer.

As liquid crystal display devices, IPS liquid crystal display devices have been known. These IPS liquid crystal display devices have pixel electrodes PIX and counter electrodes CT formed on the same substrate, and apply an electric field between each pixel electrode PIX and counter electrode CT to rotate the liquid crystal in the substrate plane in order to control the contrast. Thus, IPS liquid crystal display devices have a characteristic that tints of displayed images are not inverted when seen obliquely. To utilize this characteristic, it has been proposed to construct a semi-transmissive liquid crystal display device using an IPS liquid crystal display device, for example, in Japanese Patent Application Laid-Open Publication No. 2003-344837.

However, as also described in Japanese Patent Application Laid-Open Publication No. 2003-344837, when a semi-transmissive liquid crystal display device is constructed using an IPS liquid crystal display device, for example, there has been a problem that the transmission section is placed in normally white mode and the reflection section is placed in normally black mode, whereby the contrast are inverted between the transmission and reflection sections.

In order to address the abovementioned problem, the applicants have already filed a patent application for a semi-transmissive liquid crystal display device having a new pixel structure (see Japanese Application No. 2005-322049).

Each pixel of this semi-transmissive liquid crystal display device applied for patent is structured so that the transmission and reflection sections share a pixel electrode while each having an independent counter electrode. Thus, applying different reference voltages (counter voltage and common voltage) to the independent counter electrodes prevents inversion of the contrast between the transmission and reflection sections.

In this semi-transmissive liquid crystal display device applied for patent, the transmission section has a normally black characteristic (the section is displayed in black when no voltage is applied), and the reflection section has a normally white characteristic (the section is displayed in white when no voltage is applied).

On another hand, in an IPS liquid crystal display device, a pixel electrode PIX is disposed on the side adjacent to liquid crystal, of one of a pair of substrates. In this case, a hole is made in a counter electrode CT to form a contact hole so that a drive voltage is applied to the pixel electrode PIX via the contact hole (see Japanese Patent Application Laid-Open Publication No. 2002-328385).

However, in the liquid crystal display device described in Japanese Patent Application No. 2005-322049, when a hole is made to form a contact hole in order to apply a drive voltage to the pixel electrode PIX disposed on the side adjacent to the liquid crystal of the one substrate, as disclosed in Japanese Patent Application Laid-Open Publication No. 2002-328385, non-display sections are increased, thereby reducing the transmissivity.

In other words, when a contact hole for applying a drive voltage to the pixel electrode PIX is formed according to a related-art layout in the semi-transmissive liquid crystal display device applied for patent, non-display sections are increased, resulting in a reduction in transmissivity.

SUMMARY OF THE INVENTION

In view of the foregoing, the present invention provides a technology that improves the aperture ratio of a liquid crystal display device.

The characteristics of the present invention will be disclosed in this specification and the accompanying drawings.

Typical aspects of the invention disclosed in this application will briefly be described below.

(1) A liquid crystal display device having a liquid crystal display panel includes a first substrate, a second substrate, and liquid crystal interposed between the first and second substrates. The first substrate includes an active element, a first insulating film formed on the active element, a plurality of first electrodes disposed on the first insulating film, a second insulating film disposed on the first electrodes, and a pixel electrode disposed on the second insulating film. The pixel electrode is electrically coupled to the active element via a portion defining a contact hole formed in a portion defining a clearance between the plurality of first electrodes.

(2) At (1) above, the first insulating film has a portion defining a first contact hole formed in a portion defining a clearance between the plurality of first electrodes. The second insulating film is formed between the first electrodes and the pixel electrode and inside the portion defining a first contact hole. A portion defining a second contact hole is formed in the second insulating film inside the portion defining a first contact hole. The pixel electrode is electrically coupled to the active element via the portion defining a second contact hole.

(3) A liquid crystal display device having a liquid crystal display panel includes a first substrate, a second substrate, and liquid crystal interposed between the first and second substrates. The first substrate includes an active element, a first insulating film formed on the active element, a first electrode disposed on the first insulating film, a second insulating film disposed on the first electrode, and a pixel electrode disposed on the second insulating film. The liquid crystal display panel includes the first substrate, the second substrate, and the liquid crystal. The liquid crystal display panel has a plurality of subpixels. One subpixel of the plurality of subpixels has a transmission section and a reflection section. The pixel electrode is shared by the transmission section and the reflection section in the one subpixel. The first electrode is divided into the first electrode for the transmission section in the transmission section and the first electrode for the reflection section in the reflection section. A voltage different from the first electrode for the reflection section is applied to the first electrode for the transmission section. The pixel electrode is electrically coupled to the active element via a portion defining a contact hole formed in a portion defining a clearance between the first electrode for transmission section and the first electrode for the reflection section in the one subpixel.

(4) At (3) above, the first insulating film has a portion defining a first contact hole formed in a portion defining a clearance between the first electrode for the transmission section and the first electrode for the reflection section. The second insulating film is formed between the first electrode and the pixel electrode and inside the portion defining a first contact hole. A portion defining a second contact hole is formed in the second insulating film inside the portion defining a first contact hole. The pixel electrode is electrically coupled to the active element via the portion defining a second contact hole.

(5) At (3) or (4) above, the pixel electrode includes a connection and a comb-shaped electrode for the transmission section and a comb-shaped electrode for the reflection section. The comb-shaped electrodes are formed on both sides of the connection. The portion defining a contact hole is formed in a region of the connection. The connection is electrically coupled to the active element via the portion defining a contact hole.

(6) At (5) above, the first substrate further includes a video line disposed below the first insulating film and electrically coupled to the active element. The video line is formed so that a portion of the video line in which the connection of the pixel electrode is formed is wider. If the video line and the pixel electrode are projected on the first substrate from a direction orthogonal to the liquid crystal display panel, the wider portion of the video line and an edge of the connection of the pixel electrode overlap each other.

(7) At either one of (1) to (6), portions of edges of the first electrodes in which the portion defining a clearance is formed and in which the portion defining a contact hole is formed each have a recess.

(8) At either one of (1) to (7), the pixel electrode, the first electrodes, and the second insulating film form a holding capacitance.

(9) At either one of (1) to (8), the pixel electrode is a transparent electrode.

(10) At either one of (1) to (9), the first electrodes are each a transparent electrode.

(11) At either one of (1) to (9), the first electrodes are each a reflection electrode.

(12) At either one of (1) to (9), the first electrodes are a transparent electrode and a reflection electrode.

(13) At either one of (1) to (12), the first electrodes are each a counter electrode. The liquid crystal is driven by an electric field generated by the first electrodes and the pixel electrode.

An advantageous effect obtained by the typical aspects of the invention disclosed in this application is briefly described below.

The liquid crystal display device according to the aspects of the invention improves the aperture ratio.

BRIEF DESCRIPTION OF THE DRAWINGS

Embodiments of the present invention will be described in detail based on the following figures, wherein.

DETAILED DESCRIPTION OF THE PREFERRED EMBODIMENTS

Embodiments of the invention will now be described in detail with reference to the accompanying drawings, wherein like numbers reference like elements. Like elements will not repeatedly be described.

[Semi-Transmissive Liquid Crystal Display Device on which the Present Invention is Based]

Figure 9:
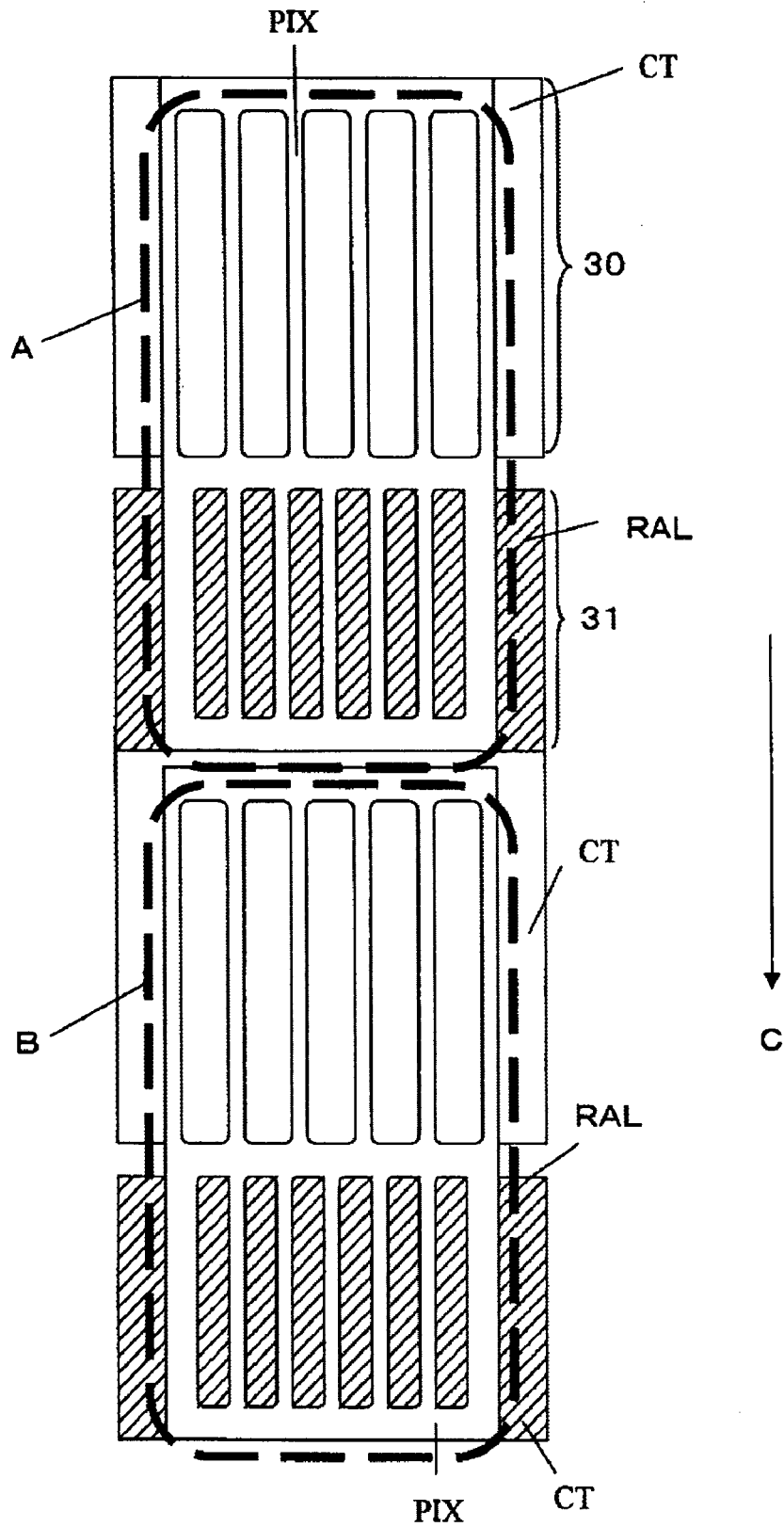
FIG. 9 is a plan view showing the electrode structure of a subpixel of a semi-transmissive liquid crystal display device on which the present invention is based.

FIG. 9 is a plan view showing the electrode structure of a subpixel of a semi-transmissive liquid crystal display device (hereinafter referred to as "the related-art example") on which the present invention is based.

In FIG. 9, 30 represents a transmission section including a transmission liquid crystal display panel, and 31 represents a reflection section including a reflection liquid crystal display panel.

In the related-art example, a transmission section and a reflection section share a pixel electrode PIX in a subpixel, while these sections each have an independent counter electrode CT. In other words, a counter electrode CT is divided into two counter electrodes: one for the transmission section and another for the reflection section. Formed on the counter electrode CT for the reflection section 31 is a reflection electrode RAL.

FIG. 9 also shows a case in which one electrode is shared by the counter electrode CT for the reflection section 31 inside one display line (display line enclosing a subpixel represented by A in FIG. 9) and the counter electrode CT for the transmission section 30 inside another display line (display line enclosing a subpixel represented by B in FIG. 9). An arrow C in FIG. 9 shows the scan direction.

Figure 10:
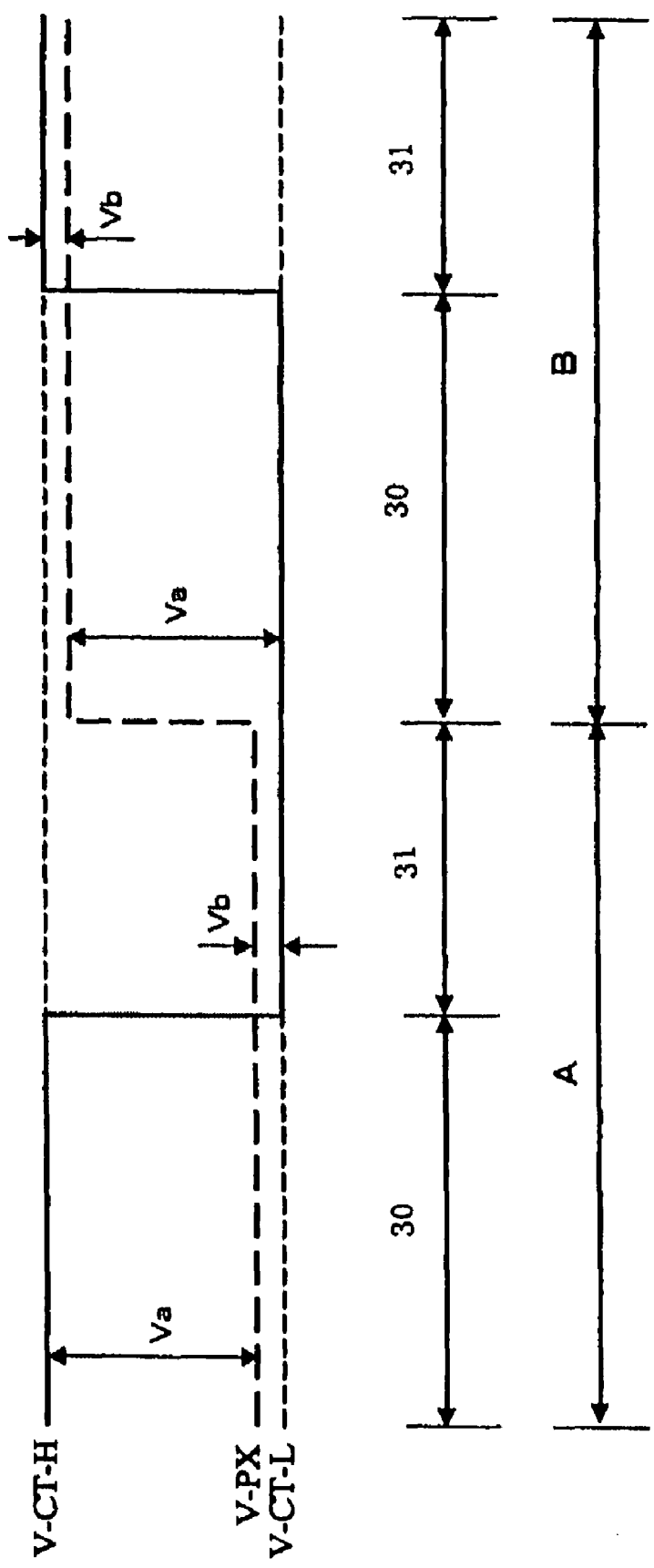
FIG. 10 is reference voltages applied to the counter electrode for the transmission section and the counter electrode for the reflection section in the semi-transmissive liquid crystal display device on which the present invention is based.

In the related-art example, as shown in FIG. 10, different reference voltages are applied to the counter electrode CT for the transmission section 30 and the counter electrode CT for the reflection section 31 in one subpixel.

For example, in a subpixel shown by A in FIG. 9, a high level (hereinafter referred to as "H-level") of reference voltage (V-CT-H) is applied to the counter electrode CT for the transmission section 30 and a low level (hereinafter referred to as "L-level") of reference voltage (V-CT-L) is applied to the counter electrode CT for the reflection section 31.

Moreover, in the subpixel shown by A in FIG. 9, a negative video voltage (V-PX) is applied to the pixel electrode PIX in the transmission section 30 and a positive video voltage (V-PX) is applied to the pixel electrode PIX in the reflection section 31. The "negative" here means that the potential of the pixel electrode PIX is lower than that of the counter electrode CT, and it does not matter whether the potential of the pixel electrode PIX is higher or lower than 0 volt. Similarly the "positive" here means that the potential of the pixel electrode PIX is higher than that of the counter electrode CT. In this case, it does not matter whether the potential of the pixel electrode PIX is higher or lower than 0 volt.

Similarly, in a pixel shown by B in FIG. 9, the L-level of reference voltage (V-CT-L) is applied to the counter electrode CT for the transmission section 30 and the H-level of reference voltage (V-CT-H) is applied to the counter electrode CT for the reflection section 31. Moreover, in the subpixel shown by B in FIG. 9, a positive video voltage (V-PX) is applied to the pixel electrode PIX in the transmission section 30 and a negative video voltage (V-PX) is applied to the pixel electrode PIX in the reflection section 31.

Here, the video voltage (V-PX) applied to the pixel electrode PIX is a potential between the H-level of reference voltage (V-CT-H) and the L-level of reference voltage (V-CT-L).

Therefore, in the pixels shown by A and B in FIG. 9, the potential difference (Va in FIG. 10) between the pixel electrode PIX and counter electrode CT becomes larger in each transmission section 30, and the potential difference (Vb in FIG. 10) between the pixel electrode PIX and counter electrode CT becomes smaller in each transmission section 31.

Thus, when the potentials shown in FIG. 10 are applied, the transmission section 30 becomes bright because the potential difference Va between the pixel electrode PIX and counter electrode CT is large. At this time, the reflection section 31 also becomes bright because the potential difference Vb between the pixel electrode PIX and counter electrode CT is small.

If the potential (potential of the video signal) of the pixel electrode PIX is changed into a potential different from that in FIG. 10 in the transmission section 30 to make the potential difference Va between the pixel electrode PIX and counter electrode CT larger, the potential difference Vb between the pixel electrode PIX and counter electrode CT is made smaller. Thus, both the transmission and reflection sections 30 and 31 become brighter.

On the contrary, if the potential (potential of the video signal) of the pixel electrode PIX is changed into a potential different from that in FIG. 10 in the transmission section 30 to make the potential difference Va between the pixel electrode PIX and counter electrode CT smaller, the potential difference Vb between the pixel electrode PIX and counter electrode CT is made larger. Thus, both the transmission and reflection sections 30 and 31 become darker.

As described above, in a subpixel of the related-art example, a counter electrode CT is divided into two counter electrodes: one for the transmission section and another for the reflection section, and reference voltages having opposite polarities (the "opposite polarities" here mean that if one reference voltage is the H-level, another is the L-level) are applied to the counter electrode CT for the transmission section 30 and that of the reflection section 31. This prevents inversion of the contrast between the transmission section 30 and reflection section 31. Specifically, although the transmission section 30 is placed in normally black mode and the reflection section 31 is placed in normally white mode, the related-art example addresses the problem of inversion of the contrast by making contrivance about the voltage applied to the counter electrode CT for the reflection section 31.

First Embodiment

Figure 1A:
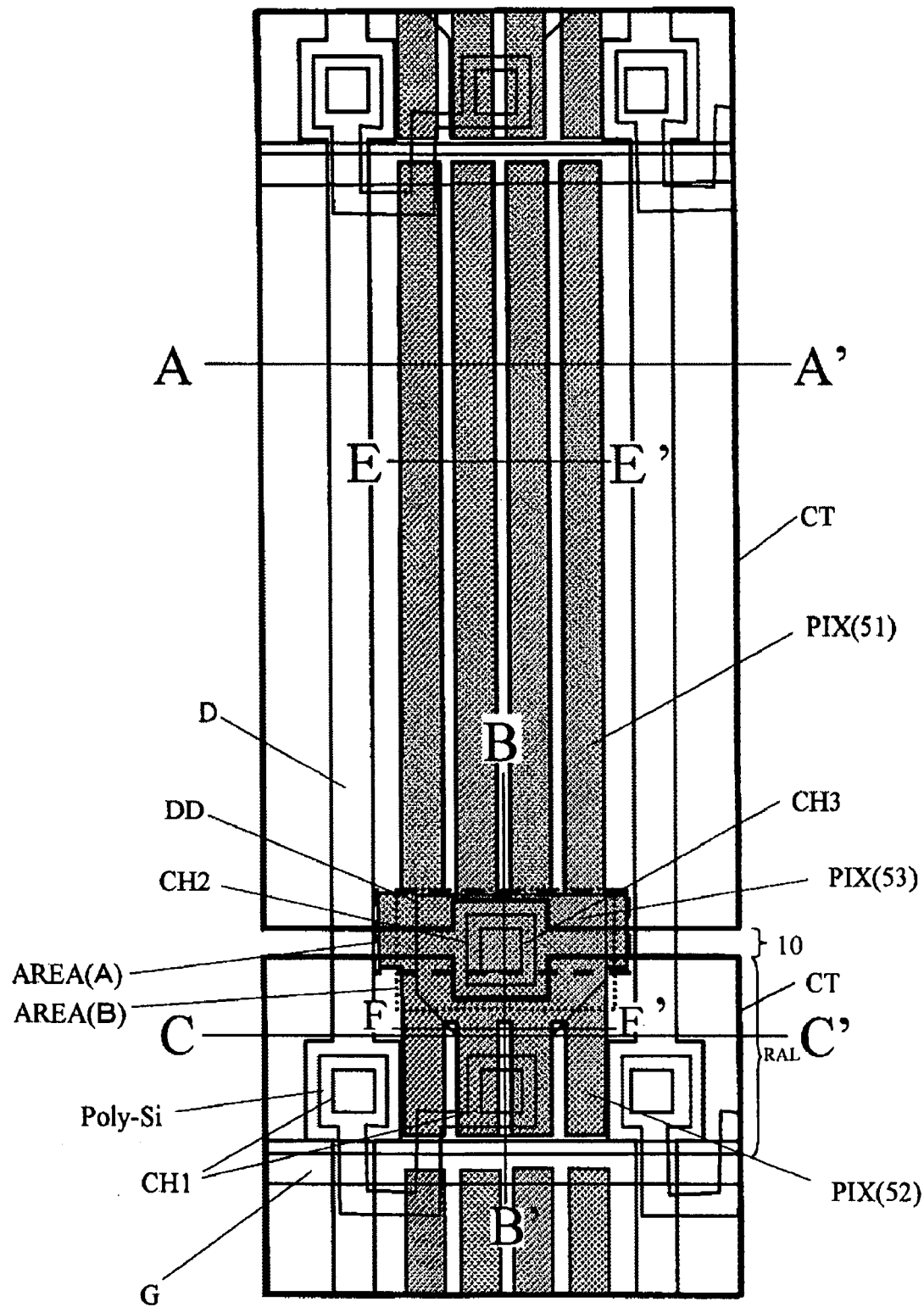
FIG. 1A is a plan view showing the electrode structure of a subpixel of a semi-transmissive liquid crystal display device according to a first embodiment of the present invention.

FIG. 1A is a plan view showing the electrode structure of a subpixel of a semi-transmissive liquid crystal display device according to a first embodiment of the present invention.

Figure 1B:
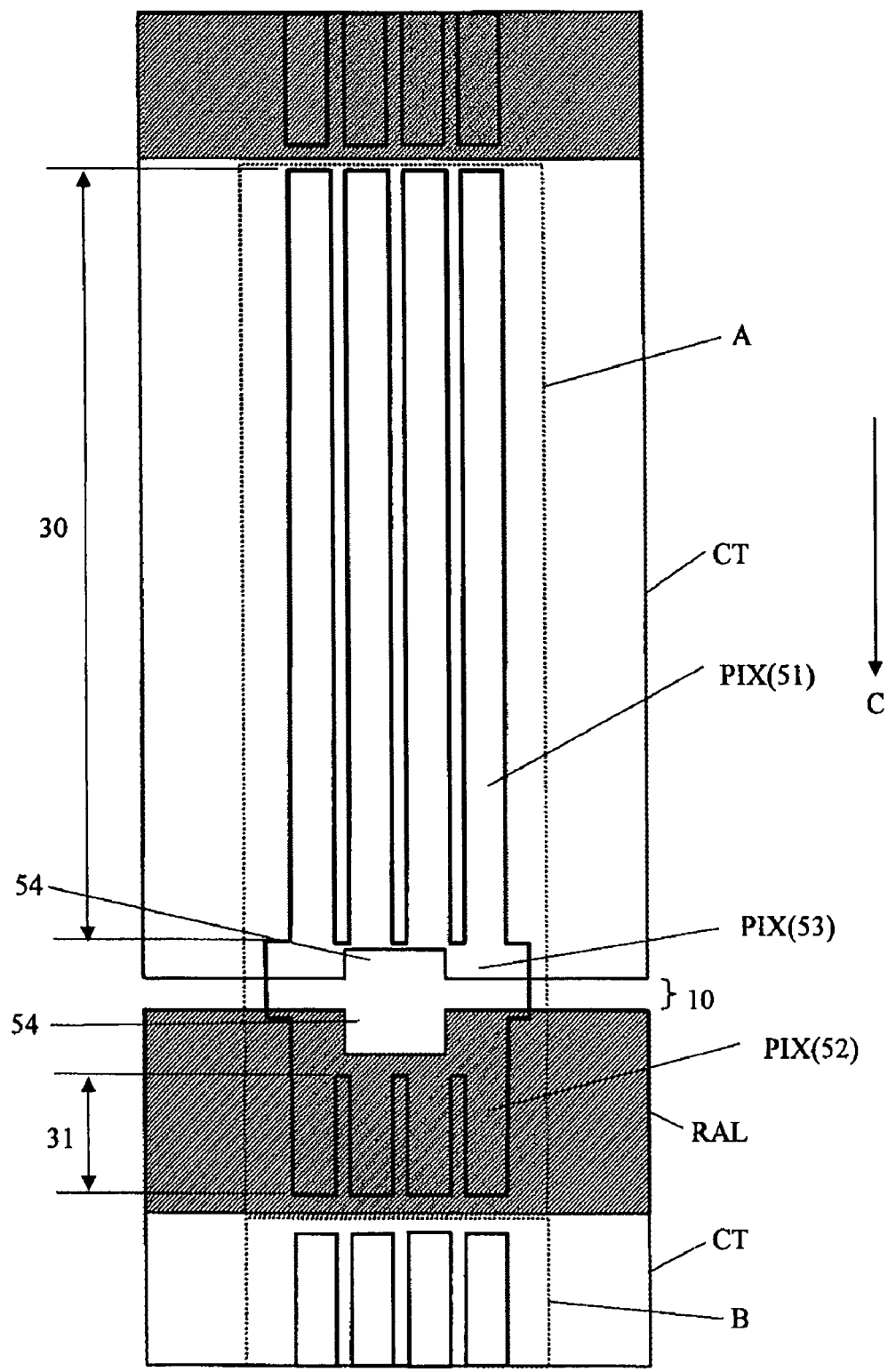
FIG. 1B is a drawing showing only a pixel electrode, a counter electrode, and a reflection electrode among elements shown in FIG. 1A.

FIG. 1B is a drawing showing only a pixel electrode, a counter electrode, and a reflection electrode among elements shown in FIG. 1A. In FIG. 1B, parts shown by dotted frames A and B each represent one subpixel.

Also in one subpixel of the semi-transmissive liquid crystal display device according to this embodiment, as shown in FIG. 1B, the transmission section 30 and reflection section 31 share one pixel electrode PIX and each have an independent counter electrode CT. In other words, a counter electrode CT is divided into two counter electrodes: one for the transmission section and another for the reflection section. A reflection electrode RAL is formed on the counter electrode CT for the reflection section 31.

In FIG. 1B, one electrode is shared by the counter electrode CT for the reflection section 31 inside one display line (display line enclosing a subpixel shown by A in FIG. 1B) of two adjacent display lines and the counter electrode CT for the transmission section 30 inside another display line (display line enclosing a subpixel shown by B in FIG. 1B). The arrow C in FIG. 1B shows the scan direction.

The pixel electrode PIX includes a connection 53, a comb-shaped electrode 51 for the transmission section and a comb-shaped electrode 52 for the reflection section formed on the sides of the connection 53. A contact hole is formed in the connection 53.

Recesses 54 for forming a contact hole are formed on the opposed edges of the counter electrodes CT.

Figure 2:
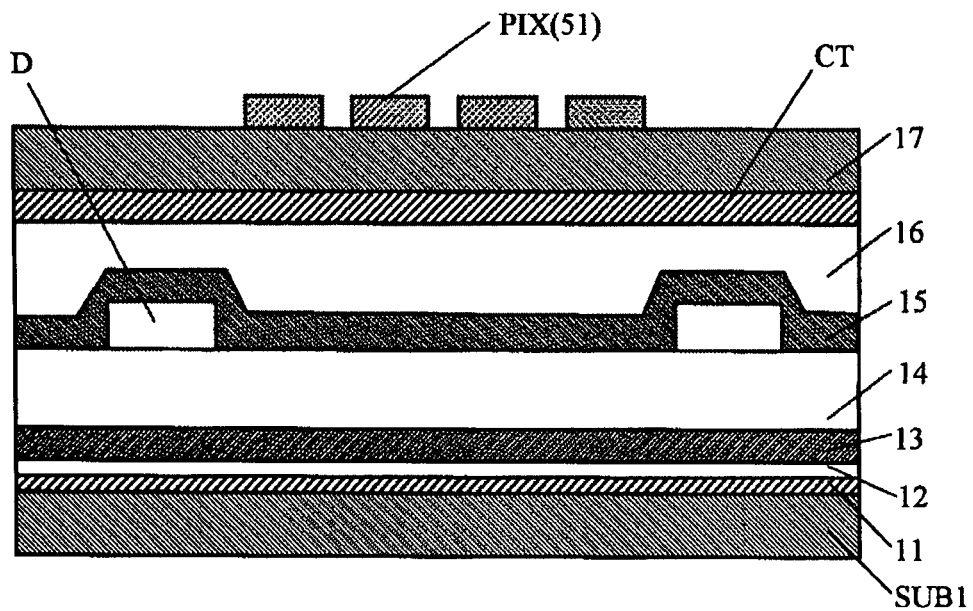
FIG. 2 is a principal part sectional view showing the sectional structure along line A-A' of FIG. 1A.
Figure 3:
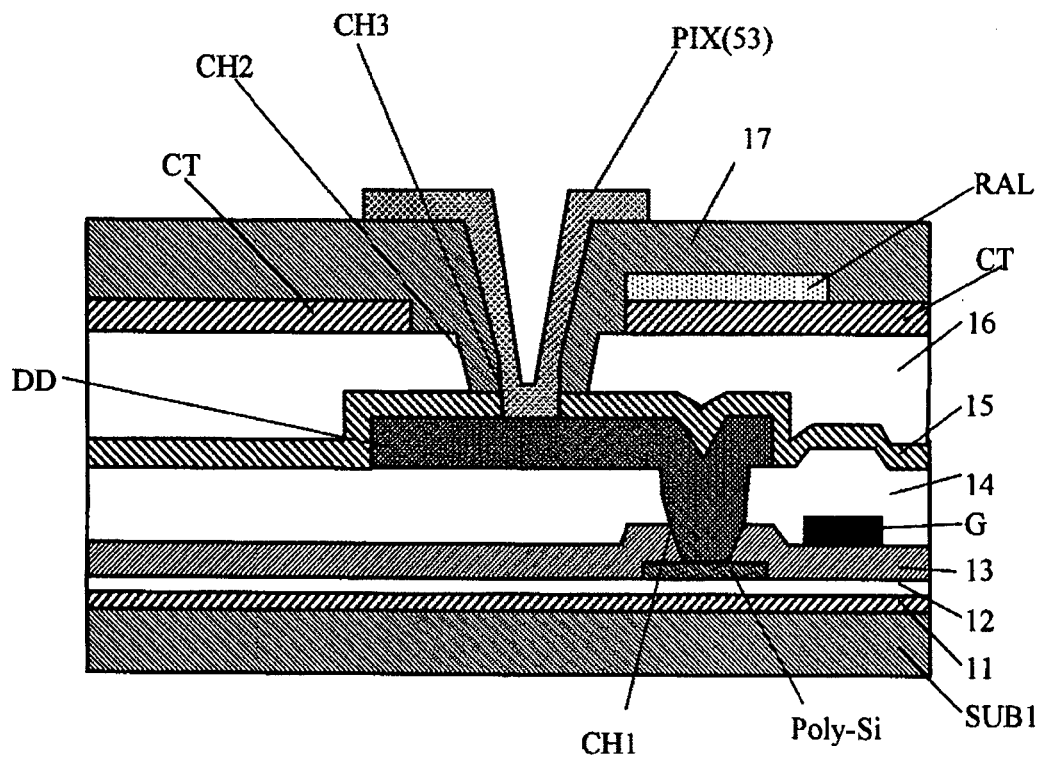
FIG. 3 is a principal part sectional view showing the sectional structure along line B-B' of FIG. 1A.
Figure 4:
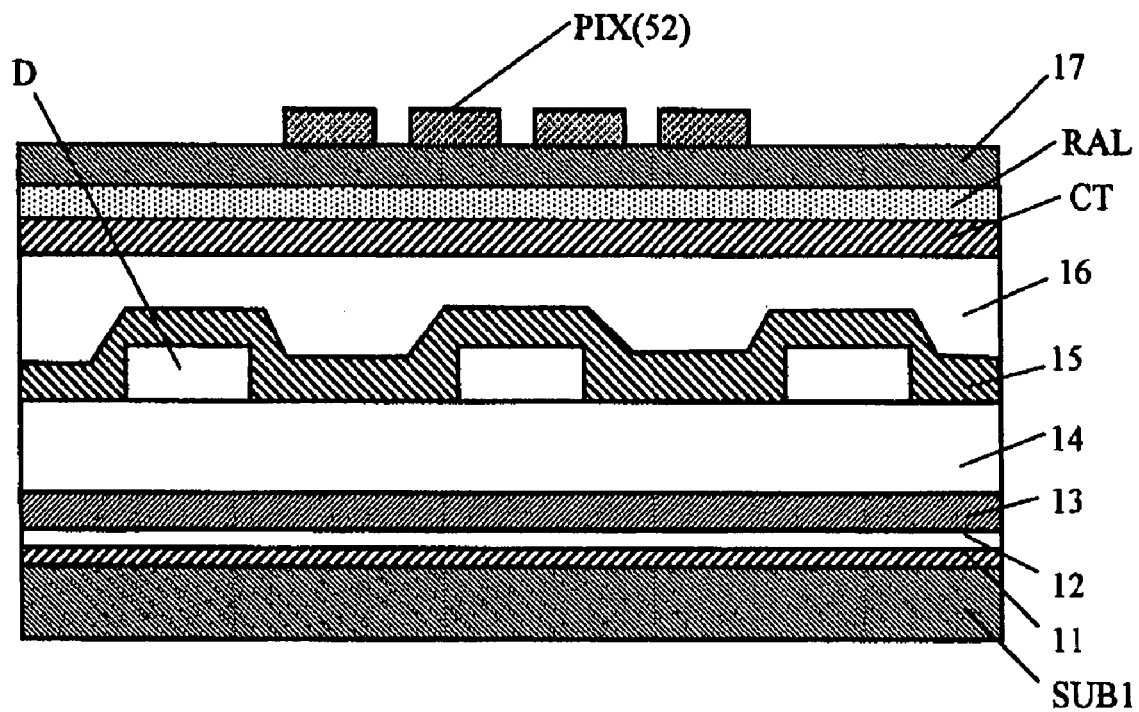
FIG. 4 is a principal part sectional view showing the sectional structure along line C-C' of FIG. 1A.

FIG. 2 is a principal part sectional view showing the sectional structure along line A-A' of FIG. 1A, FIG. 3 is a principal part sectional view showing the sectional structure along line B-B' of FIG. 1A, FIG. 4 is a principal part sectional view showing the sectional structure along line C-C' of FIG. 1A, FIG. 5A is a principal part sectional view showing the sectional structure along line E-E' of FIG. 1A, and FIG. 5B is a principal part sectional view showing the sectional structure along line F-F' of FIG. 1A.

FIG. 5A shows the sectional structure along line E-E' of FIG. 1A, that is, the sectional structure of the transmission section 30, and FIG. 5B shows the sectional structure along line F-F' of FIG. 1A, that is, the sectional structure of the reflection section 31.

Now the overall structure of the semi-transmissive liquid crystal display device according to this embodiment will be described referring to FIGS. 5A and 5B. In this embodiment, a pair of glass substrates (SUB1, SUB2) are disposed with a liquid crystal layer containing liquid molecules (LC) therebetween. Here, the main surface of the glass substrate SUB2 is observed.

On the glass substrate SUB2 in the transmission section 30, a black matrix (not shown), a color filter FIR, an insulating film 18, and an orientation film OR2 are formed sequentially from the glass substrate SUB2 toward the liquid crystal layer.

The structure of the glass substrate SUB 2 in the reflection section 31 is similar to the transmission section 30 except that a step forming layer MR is formed between the insulating layer 18 and orientation film OR2. Formed outside the glass substrate SUB2 is a polarizing plate POL2.

On the glass substrate SUB1 side of the transmission section 30, inter-layer insulating films 11 to 16, a counter electrode CT, an inter-layer insulating film 17, a pixel electrode PIX, an orientation film OR1 are formed sequentially from the glass substrate SUB1 toward the liquid crystal layer.

The structure of the glass substrate SUB 1 side in the reflection section 31 is similar to the transmission section 30 except that the reflection electrode RAL is formed between the counter electrode CT and the inter-layer insulating film 17. Formed outside the glass substrate SUB1 is a polarizing plate POL1.

In FIGS. 2 to 5, D represents a video line (may be referred to as "source line" or "drain line"), G a scan line (may be referred to as "gate line"), poly-Si a semiconductor layer, DD the source electrode of a thin film transistor, CH1 to CH3 contact holes, and EFS an electric flux line.

The pixel electrode PIX and counter electrode CT are each made of a transparent conductive film, such as indium tin oxide (ITO).

The counter electrode CT is formed into a plane. The pixel electrode PIX and the counter electrode CT overlap each other with the inter-layer insulating film 17 therebetween, thereby forming a holding capacitance.

The step forming layer MR is a layer for adjusting the cell gap length d of the liquid crystal LC in the reflection section so that the light path length in the reflection section 31 is one equivalent to a λ/4 wavelength plate. The reflection electrode RAL includes a metal film made of aluminum (Al), but not limited to this. For example, the reflection electrode RAL may includes two layers: a lower layer made of molybdenum (Mo) and an upper layer made of aluminum (Al).

When the counter electrode CT is divided into one counter electrode for the transmission section 30 and another counter electrode for the reflection section 31 as shown in this embodiment, an electric field that is uncontrollable by the pixel electrode PIX occurs in a clearance (or gap) 10 between the opposed counter electrodes CT. This is because different voltages are applied to the two counter electrodes.

This, for example, creates a light leakage point in the transmission section 30 adjacent to the clearance 10 between the opposed counter electrodes CT when black is displayed, resulting in a reduction in the contrast of the transmission section 30.

To address this problem, the pixel electrode PIX is superimposed on the clearance 10 between the opposed counter electrodes CT. This makes it possible to control the driving of the liquid crystal by an electric field generated among the pixel electrode PIX and the opposed counter electrodes CT even in the clearance 10 between the opposed counter electrodes CT. Thus, light leakage can be suppressed.

In order to couple the source electrode DD of the thin film transistor located below the counter electrode CT to the pixel electrode PIX located above the counter electrode CT, it is required to make an opening in the counter electrode CT and then to form, in the opening, a contact hole CH3 for coupling the source electrode DD to the pixel electrode PIX.

In the contact hole (CH3), the liquid crystal orientation is disturbed due to the inclined surface thereof, resulting in a reduction in the liquid crystal drive efficiency of the electric field. Therefore, it is required to minimize the area occupied by the contact hole (inefficient display area B (AREA (B)). Even though a contact hole is located above the clearance 10 between the opposed counter electrodes CT, the electric field is weak, resulting in a low liquid drive efficiency. Therefore, it is required to reduce the area occupied by such a contact hole (inefficient display area A (AREA (A)).

To address this problem, the clearance 10 between the opposed counter electrodes CT is used as an opening required to form the contact hole CH3. This makes it possible to reduce the area occupied by the low liquid crystal drive efficiency position. Thus, the aperture ratio can substantially be improved.

Figure 11:
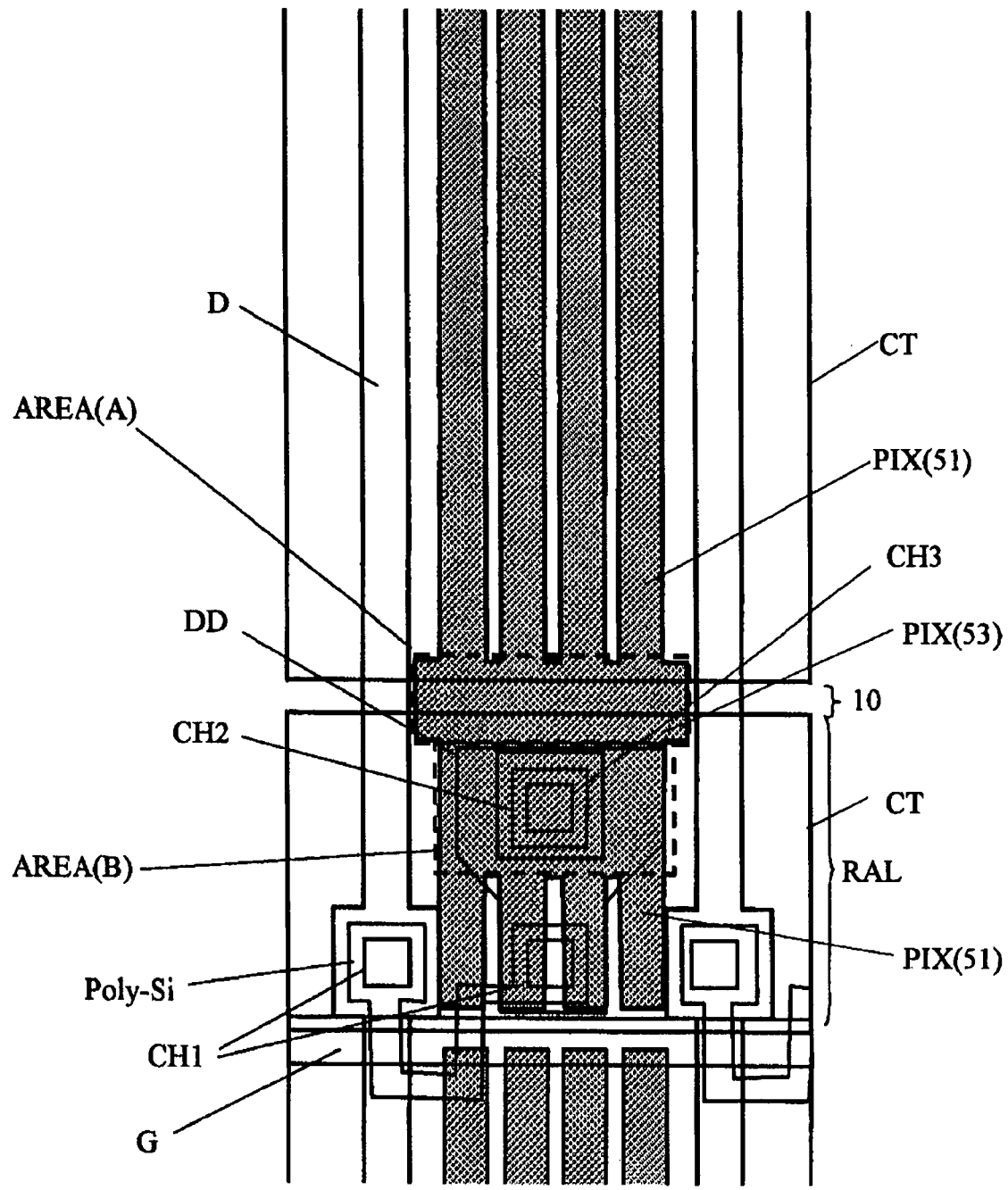
FIG. 11 is a plan view showing the electrode structure of a subpixel of a related-art semi-transmissive liquid crystal display device.

FIG. 11 shows the electrode structure of a subpixel of a related art semi-transmissive liquid crystal display device.

From a comparison of FIG. 1A and FIG. 11, it is understood that in this embodiment, an inefficient display area obtained by combining the inefficient display area B (AREA (B)) and the inefficient display area A (AREA (A)) is smaller than the total of the inefficient display area B (AREA (B)) and the inefficient display area A (AREA (A)) in the related art semi-transmissive liquid crystal display device.

The method for manufacturing each element in FIGS. 2, 3, 4, 5A and 5B will now be described. The steps prior to the step (1) are typical ones, so will not be described.

(1) Inter-layer insulating film 15: In order to form a video line D, an aluminum material is formed and then patterned. An SiN film is formed in a thickness of 200 nm by chemical vapor deposition (CVD).

(2) Inter-layer insulating film 16: The formed inter-layer insulating film 15 is coated with a photosensitive resin. The photosensitive resin is exposed to light with a photomask drawn into a desired pattern as a mask, and the resist is partially removed using an alkaline developer. At this time, the resist at the position corresponding to the contact hole CH2 is removed.

As for the calcining condition, it is assumed that the resin is calcined at 230° C. for 60 minutes so that the bumps and dips on the substrate surface are controlled and, in this embodiment, the substrate surface is approximately flat except for the portion defining the contact hole.

It is also assumed that the thickness of the inter-layer insulating film 16 is approximately 1.8 μm (flat portion of the pixel electrode surface (except for the portion defining the contact hole)) after calcining.

(3) A counter electrode CT and an amorphous ITO (77 nm) are formed by sputtering, and then coated with a photosensitive resist. The resist is exposed to light with a photomask drawn into a desired pattern as a mask, and partially removed using an alkaline developer (if a positive resist is used, the exposed portion is removed). The resist is removed with the pattern of the resist as a mask using an ITO etching liquid (e.g., oxalic acid). In this embodiment, contrivance is made in patterning so that the contact hole CH 3 is located between the opposed counter electrodes.

Subsequently, the resist is removed using a resist removing liquid (e.g. monoethanolamine (MEA)). Finally, the amorphous ITO is subjected to heat treatment at 230° C. for 60 minutes and crystallized so that the amorphous ITO is not dissolved by oxalic acid used when processing a reflection electrode (RAL; AlSi/MoW) to be formed in the following step.

(4) Reflection electrode RAL: MoW (50 nm) and then AlSi (150 nm) are formed by sputtering, and coated with a photosensitive resist. The resist is exposed to light with a photomask drawn into a desired pattern as a mask, and partially removed using an alkaline developer (when a positive resist is used, the exposed portion is removed). The resist is removed with the pattern of the resist as a mask using an ITO etching liquid (e.g., oxalic acid). In this embodiment, contrivance is made in patterning so that the contact hole CH 3 is located between the opposed counter electrodes.

Subsequently, the resist is removed using a resist removing liquid (e.g. monoethanolamine (MEA)). In this embodiment, contrivance is made in patterning the resist so that a reflection electrode RAL is formed only on one counter electrode CT in the vicinity of the contact hole (CH3).

(5) Inter-layer insulating film 17: Formed in a similar manner to the inter-layer insulating film 16. Note that in this embodiment, the inter-layer insulating film 17 is also formed inside the contact hole CH2, a hole is made in this inter-layer insulating film 17, the inter-layer insulating film 15 below the inter-layer insulating film 17 is processed using the pattern of the inter-layer insulating film 17 to form a contact hole CH3. The inter-layer insulating film 15 is processed by dry-etching using ($SF_6+O_2$) or $CF_4$.

(6) Pixel electrode PIX: ITO (77 nm) are formed by sputtering, and then coated with a photosensitive resist. The resist is exposed to light with a photomask drawn into a desired pattern as a mask, and partially removed using an alkaline developer (if a positive resist is used, the exposed portion is removed). The resist is removed with the resist pattern as a mask using an ITO etching liquid (e.g. oxalic acid). Subsequently, the resist is removed using a resist removing liquid (e.g. monoethanolamine (MEA)). The pixel electrode is formed in a comb-shaped pattern on the counter electrode CT.

Figure 6:
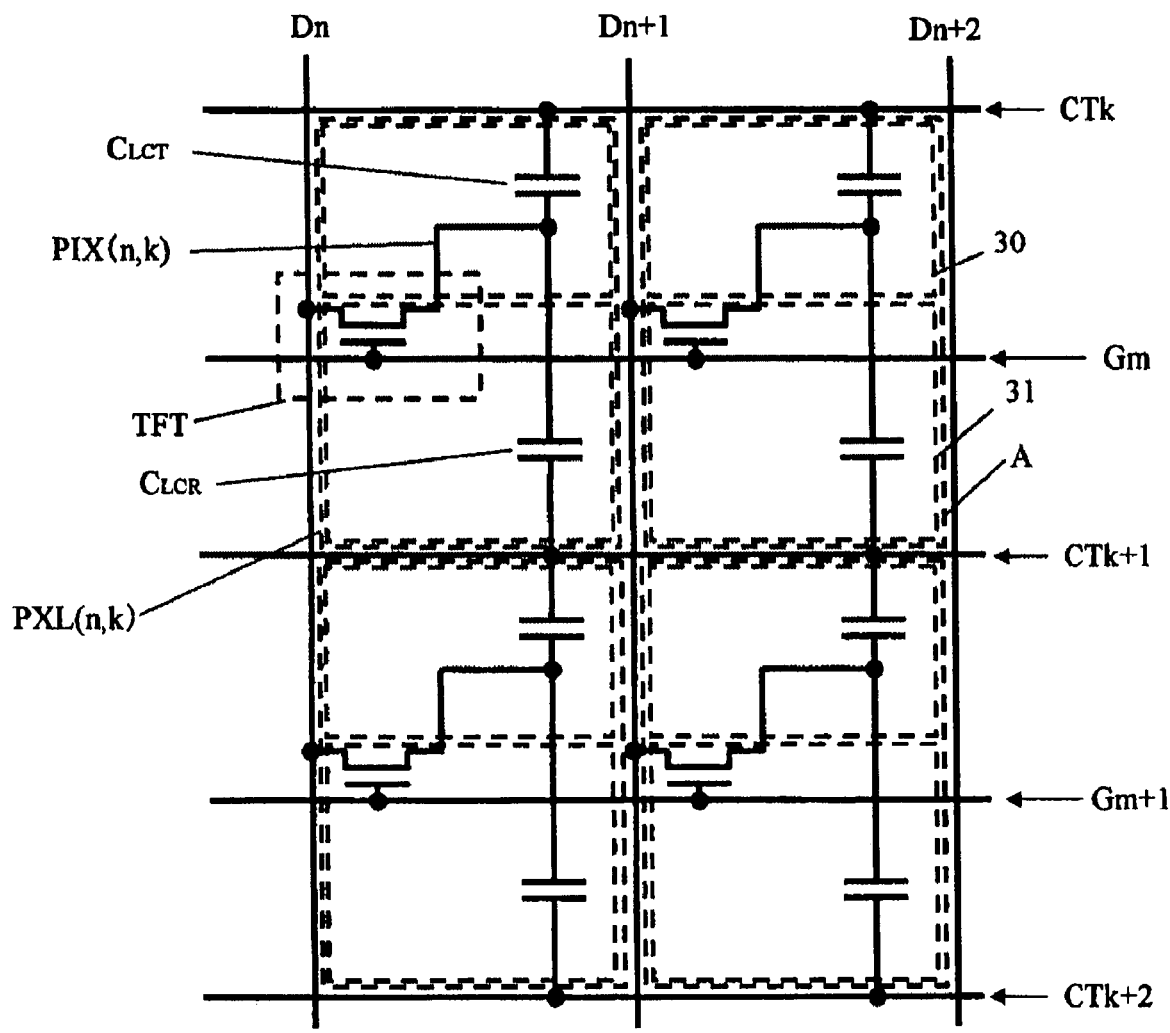
FIG. 6 is a diagram showing an equivalent circuit of a liquid crystal display panel included in the semi-transmissive liquid crystal display device according to the first embodiment.

FIG. 6 shows an equivalent circuit of a liquid crystal display panel included in the semi-transmissive liquid crystal display device according to this embodiment.

In FIG. 6, Dn, Dn+1, and Dn+2 represent n-th, (n+1)th, and (n+2)th video lines, respectively, Gm and Gm+1 represent m-th and (m+1)th scan lines, respectively, CTk, CTk+1, and CTk+2 represent k-th, (k+1)th, and (k+2)th counter electrodes, respectively, A represents one subpixel, $C_{LCT}$ represents the liquid crystal capacity of the transmission section 30, and $C_{LCT}$ represents the liquid crystal capacity of the reflection section 31.

The direction of extension of the video line D and the directions of extension of the scan line G and counter electrode CT intersect each other or are orthogonal to each other. The counter electrodes CT are disposed in the form of stripes.

The source electrode of a thin film transistor TFT is coupled to a video line D. The voltage of the video line D is supplied to a pixel electrode PIX via the thin transistor TFT.

The gate electrode of the thin film transistor TFT is coupled to a scan line G. The scan line G turns on/off the thin film transistor.

In this embodiment, the transmission section 30 and reflection section 31 share one pixel electrode PIX in a subpixel, and have different counter electrodes CT that have different potentials.

When the voltage of the scan line Gm becomes the H-level, the thin film transistor TFT is turned on and the video potential is written to the pixel electrode PIX (n, k).

Even after the voltage of the scan line Gm becomes the L-level, the voltage written when the voltage is H-level is held by the holding capacitance provided in the subpixel PXL until the scan line Gm becomes the H-level in the following frame. As described above, the holding capacitance is formed by the counter electrode CT formed into a plane, the pixel electrode PIX, and the inter-layer insulating film 17 formed between the counter electrode CT and pixel electrode PIX.

The counter electrode CTk and counter electrode CTk+1 have different levels of voltages. For example, when the counter electrode CTk has the H-level of voltage, the counter electrode CTk+1 has the L-level of voltage (note that the time period immediately before the voltage of the scan line Gm becomes the H-level is excluded).

The liquid crystal molecules LC in the transmission section 30 are driven by the potential difference between the counter electrode CTk and pixel electrode PIX(n, k). The liquid crystal molecules LC in the reflection section 31 are driven by the potential difference between the counter electrode CTk+1 and pixel electrode PIX(n, k).

In this embodiment, as described above, the voltages applied to the liquid crystal molecules in the transmission section 30 and those in the reflection section 31 are controlled.

Figure 7:
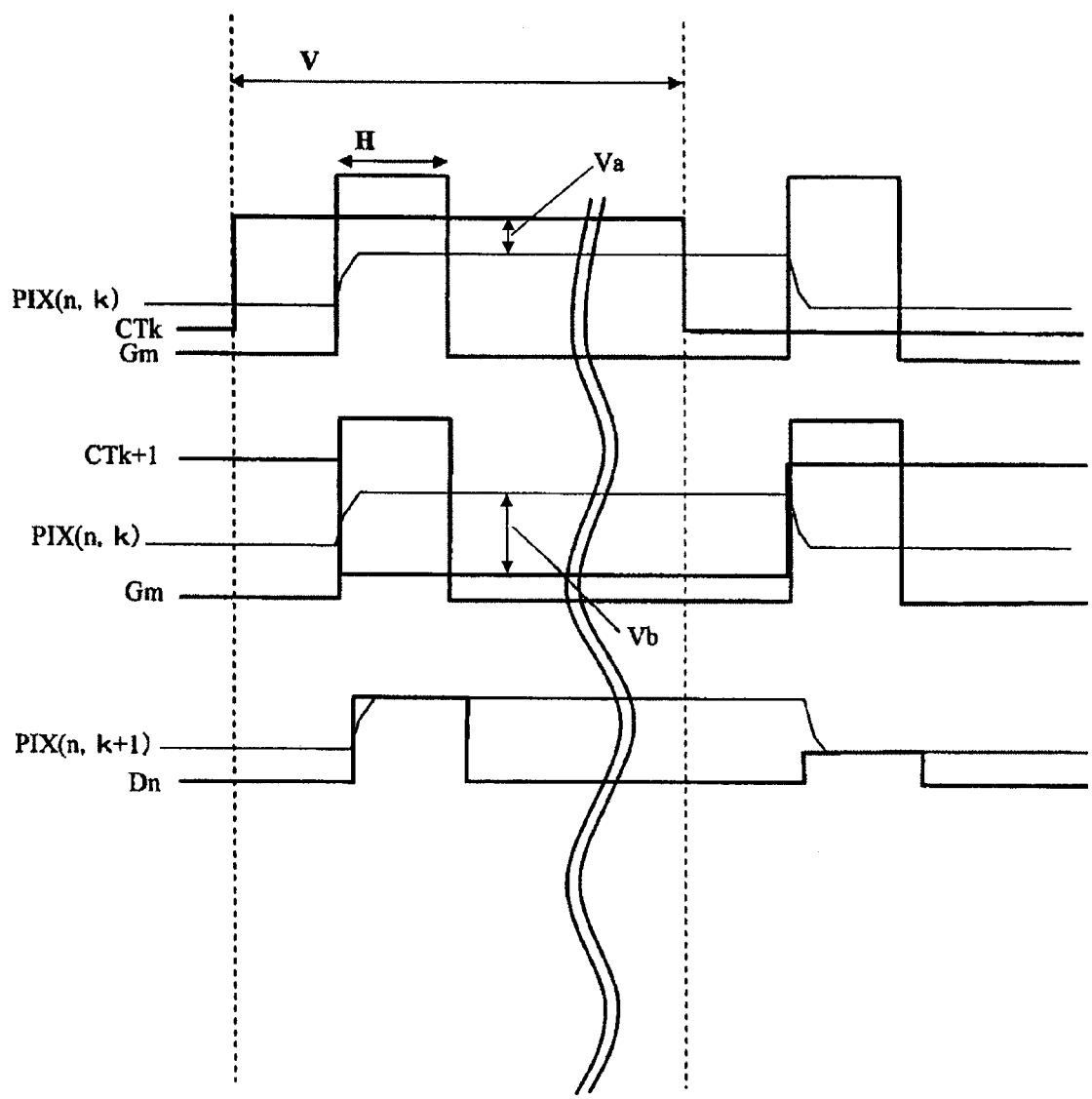
FIG. 7 is a diagram showing the voltage wavelength of a subpixel (PXL (n, k)) shown in FIG. 6.

FIG. 7 shows the waveforms of the subpixels PXL (n, k) shown in FIG. 6. In FIG. 7, Va represents the potential difference between the pixel electrode PIX and counter electrode CT in the transmission section 30, Vb represents the potential difference between the pixel electrode PIX and counter electrode CT in the reflection section 31, H represents the horizontal scan period, and V represents the vertical scan period (frame period).

In this embodiment, it is assumed that the cell gap length and retardation ($\Delta n \cdot d$) of the transmission section 30 are 4 μm and 320 nm, respectively, and the cell gap length and retardation ($\Delta n \cdot d$) of the reflection section 31 are 2.4 μm and 192 nm, respectively, where $\Delta n$ represents the anisotropic refractive index of the liquid crystal ($\Delta n=0.08$ in this embodiment), and d represents the liquid crystal cell gap length. As for liquid crystal, positive liquid crystal is used.

The polarizing axis of the upper polarizing plate POL2 is made to align with the initial orientation axis (rubbing axis) of the liquid crystal, forming an angle of 75°. The polarizing axis of the lower polarizing plate POL1 is made to be orthogonal to the polarizing axis of the upper polarizing plate POL2, forming an angle of 165°. The transmission section 30 is placed in normally black mode. The 75° and 165° represent the angles measured counterclockwise assuming that the horizontal direction (direction of extension of the scan line G) is 0°.

Since the axes are set up as described above in both the transmission section 30 and reflection section 31, light that enters from the glass substrate SUB2 and then reflects from the reflection electrode RAL passes through the upper polarizing plate POL2 if no electric field is applied to the liquid crystal. This is because the polarizing condition of the light is not changed by the liquid crystal in the light path thereof. In other words, the reflection section 31 is placed in normally white mode.

It is desirable to match the display condition of the transmission section 30 and that of the reflection section 31 with each other in terms of image quality. More specifically, when the transmission section 30 is displayed in black, the reflection section 31 is preferably displayed in black as well, and when the transmission section 30 is displayed in while, the reflection section 31 is preferably displayed in white as well.

For this reason, the transmission section 30 and reflection section 31 share one pixel electrode PIX, and one counter electrode CT is divided into two counter electrodes: one for the transmission section 30 and another for the reflection section 31. This allows the transmission section 30 and reflection section 31 to drive the liquid crystal separately.

Figure 5:
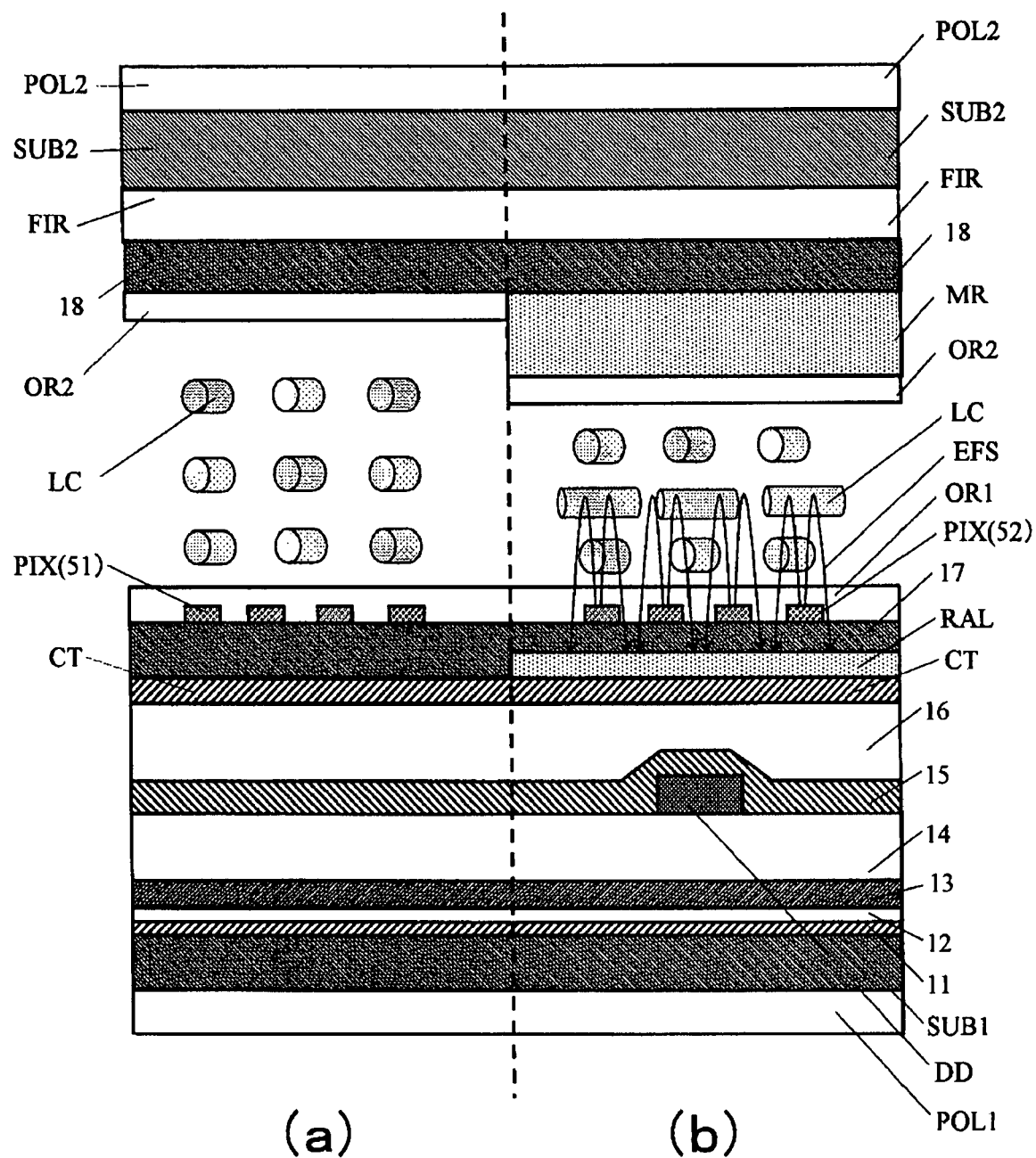
FIG. 5($a$) is a principal part sectional view showing the sectional structure along line E-E' of FIG. 1A and FIG. 5($b$) is a principal part sectional view showing the sectional structure along line F-F' of FIG. 1A.

FIG. 5 shows a situation in which an electric field is generated only between the pixel electrode PIX(52) and counter electrode CT in the reflection section 31 without generating any electric field between the pixel electrode PIX(51) and counter electrode CT in the transmission section 30 whereby both the transmission section 30 and reflection section 31 are displayed in black.

Second Embodiment

Figure 8:
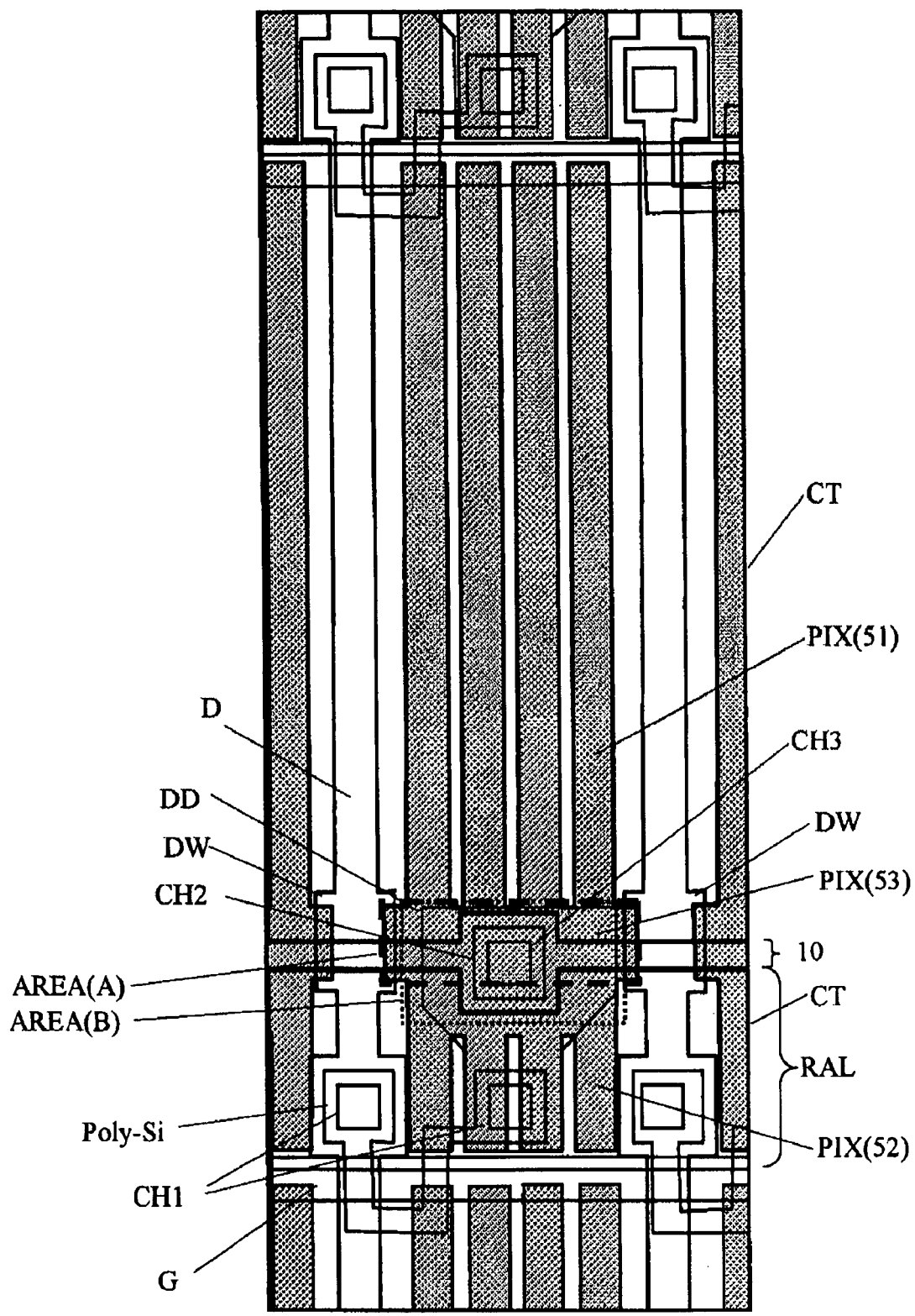
FIG. 8 is a plan view showing the electrode structure of a subpixel of a semi-transmissive liquid crystal display device according to a second embodiment of the present invention.

FIG. 8 is a plan view showing the electrode structure of a subpixel of a semi-transmissive liquid crystal display device according to a second embodiment of the present invention.

As shown by DW in FIG. 8, the semi-transmissive liquid crystal display device according to this embodiment is different from that according to the first embodiment shown in FIG. 1A in that the video line D is partially thickened below the clearance 10 and the connection 53 of the pixel electrode PIX.

The semi-transmissive liquid crystal display device according to this embodiment will now be described below focusing on the differences from that according to the first embodiment.

If the clearance 10 between the opposed counter electrodes CT is covered by the pixel electrode PIX as in the first embodiment, the pixel electrode PIX comes close to a connection 53 of an adjacent subpixel because the connection 53 of the pixel electrode PIX extends in the transverse direction (direction of extension of the scan line G) above the clearance between the opposed counter electrodes CT.

As a result, an electric field may occur between the pixel electrode PIX and a pixel electrode PIX of the adjacent subpixel or between the pixel electrode PIX and a counter electrode CT of the adjacent subpixel, thereby causing light leakage in the transmission section 30.

To address this problem, in this embodiment, the video line D below the connection 53 of the pixel electrode PIX is partially thickened as shown by DW in FIG. 8, thereby preventing the abovementioned light leakage. In other words, the widened portion DW of the video line D disposed below the counter electrode CT blocks transmitted light to prevent light leakage.

While the invention made by the inventors has heretofore been described concretely based on the embodiments, the present invention is not limited to these embodiments. Various modifications can be made to those embodiments without departing from the scope and spirit of the invention.

What is claimed is:

1. A liquid crystal display device including a liquid crystal display panel, comprising:
 a first substrate, the first substrate including:
  an active element;
  a first insulating film formed on the active element;
  a plurality of first electrodes disposed on the first insulating film;
  a second insulating film disposed on the first electrodes; and
  a pixel electrode disposed on the second insulating film;
 a second substrate; and
 liquid crystal interposed between the first and second substrates,
 wherein the liquid crystal display panel has a plurality of subpixels;
 each of the plurality of subpixels has a transmission section and a reflection section;
 the pixel electrode is shared by the transmission section and the reflection section in each of the subpixels;
 the first electrodes are divided into a first electrode for the transmission section in the transmission section and a first electrode for the reflection section in the reflection section;
 the first electrode for the transmission section and the first electrode for the reflection section being insulated from each other;
 a voltage different from the first electrode for the reflection section is applied to the first electrode for the transmission section;
 the pixel electrode is electrically coupled to the active element via a portion defining a contact hole formed in a portion defining a clearance between the first electrode for the transmission section and the first electrode for the reflection section in each of the subpixels.

2. The liquid crystal display device according to claim 1, wherein the first insulating film has a portion defining a first contact hole formed in a portion defining a clearance between the first electrode for the transmission section and the first electrode for the reflection section;
 the second insulating film is formed between the first electrode and the pixel electrode and inside the portion defining a first contact hole;
 a portion defining a second contact hole is formed in the second insulating film inside the portion defining a first contact hole; and
 the pixel electrode is electrically coupled to the active element via the portion defining a second contact hole.

3. The liquid crystal display device according to claim 1, wherein the pixel electrode includes:
 a connection; and
 a comb-shaped electrode for the transmission section and a comb-shaped electrode for the reflection section, the comb-shaped electrodes being formed on both sides of the connection;
 the portion defining a contact hole is formed in a region of the connection; and
 the connection is electrically coupled to the active element via the portion defining a contact hole.

4. The liquid crystal display device according to claim 3, wherein the first substrate further includes a video line disposed below the first insulating film and electrically coupled to the active element;
 the video line is formed so that a portion of the video line in which the connection of the pixel electrode is formed is wider; and
 if the video line and the pixel electrode are projected on the first substrate from a direction orthogonal to the liquid crystal display panel, the wider portion of the video line and an edge of the connection of the pixel electrode overlap each other.

5. The liquid crystal display device according to claim 1, wherein portions of edges of the first electrodes in which the portion defining a clearance is formed and in which the portion defining a contact hole is formed each have a recess.

6. The liquid crystal display device according to claim 1, wherein the pixel electrode, the first electrode, and the second insulating film form a holding capacitance.

7. The liquid crystal display device according to claim 1, wherein the pixel electrode is a transparent electrode.

8. The liquid crystal display device according to claim 1, wherein the first electrodes include a transparent electrode.

9. The liquid crystal display device according to claim 1, wherein the first electrodes include a reflection electrode.

10. The liquid crystal display device according to claim 1, wherein the first electrodes include a transparent electrode and a reflection electrode.

11. The liquid crystal display device according to claim 1, wherein the first electrodes are counter electrodes; and the liquid crystal is driven by an electric field generated by the first electrodes and the pixel electrode.

* * * * *